United States Patent [19]

Cuntz et al.

[11] Patent Number: 5,392,197
[45] Date of Patent: Feb. 21, 1995

[54] MOISTURE PROOF OF ELECTRIC DEVICE FOR MOTOR VEHICLES

[75] Inventors: Harald Cuntz, Crailsheim; Martin Rau, Oberiexingen; Dieter Karr, Tiefenbronn, all of Germany

[73] Assignee: Robert Bosch GmbH, Stuttgart, Germany

[21] Appl. No.: 30,361

[22] PCT Filed: Aug. 14, 1992

[86] PCT No.: PCT/DE92/00683
§ 371 Date: Mar. 18, 1993
§ 102(e) Date: Mar. 18, 1993

[87] PCT Pub. No.: WO93/05635
PCT Pub. Date: Mar. 18, 1993

[30] Foreign Application Priority Data

Sep. 3, 1991 [DE] Germany ............................ 4129238

[51] Int. Cl.⁶ .............................................. H05K 9/00
[52] U.S. Cl. ........................................ 361/818; 361/765;
361/748; 361/816; 174/35; 174/524; 257/668
[58] Field of Search ............... 361/719, 736, 748, 765,
361/816, 818; 174/35 R, 52.4, 257, 258;
257/668, 684

[56] References Cited

U.S. PATENT DOCUMENTS 4,661,888 4/1987 Jewell .

FOREIGN PATENT DOCUMENTS 369220 4/1982 Austria .
0169329 1/1986 European Pat. Off. .
2626328 12/1976 Germany .
59-195850 7/1984 Japan .................... 257/684

Primary Examiner—Leo P. Picard
Assistant Examiner—Young Whang
Attorney, Agent, or Firm—Michael J. Striker

[57] ABSTRACT

The electric device has a printed circuit board (10) which carries an electronic circuit with electronic components (12). The circuit is provided with a plug connector strip (14) for making electrical contact. In addition to the housing cover (27) and housing base (32), additional plastic coverings (16, 23) which are tight against moisture are provided to protect the circuit against moisture in a reliable manner and cover the printed circuit board on the upper side (11) and the underside (22) in the manner of a hood. These plastic parts are connected with the printed circuit board so as to be tight against moisture. The housing cover (27) and housing base (30) need not carry out any sealing functions and serve exclusively to protect against mechanical damage and, under certain circumstances, for shielding.

12 Claims, 1 Drawing Sheet

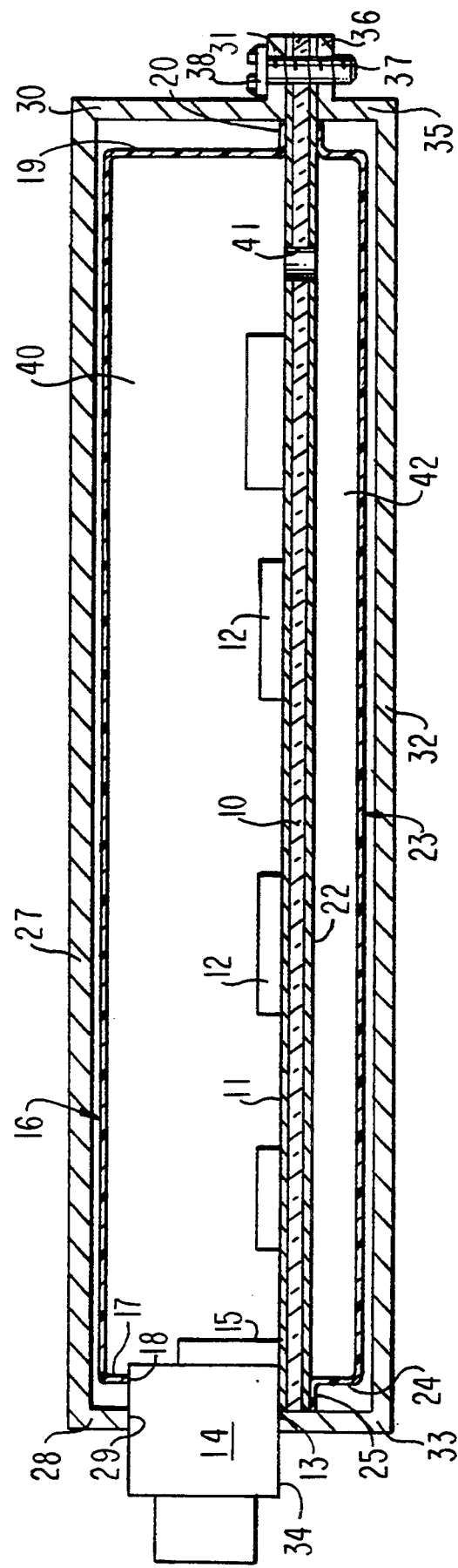

MOISTURE PROOF OF ELECTRIC DEVICE FOR MOTOR VEHICLES

BACKGROUND OF THE INVENTION

The invention relates to an electric device and, more particularly, to a switching and control device for a motor vehicle. Such known devices have a printed circuit board or conductor foil on which an electronic circuit is arranged. The assembled printed circuit board is accommodated in a housing to protect the circuit and/or its components against mechanical damage and various environmental influences. Particularly when such switching or control devices are used in motor vehicles the protective functions of the housing depend on the installation location and include, for example, protection against moisture, dust and mechanical damage. Also, these housings often serve as shielding or to improve electromagnetic compatibility.

Costly sealing means are required for protecting the circuit and its components, particularly against dust and especially against moisture. For this purpose, structural component parts of the housings are usually outfitted with depressions or grooves in which corresponding seals or sealing rings are inserted. Also, such switching or control devices must be provided with costly pressure equalization members or measures to compensate for fluctuations in pressure brought about by changes in temperature. However, the transporting of moisture must be prevented in this pressure compensation. Construction costs for such switching or control devices are accordingly high and such devices are therefore expensive.

SUMMARY OF THE INVENTION

According to the invention, the electric device comprises a housing; at least one printed circuit board arranged in the housing and carrying an electronic circuit; and at least one covering means for protecting the electronic circuit against moisture arranged in the housing.

The electric device, according to the invention, claim has the advantage over the prior art that a reliable protection of the printed circuit board or conductor foil and the circuit components against dust and especially against moisture is ensured in a simple and inexpensive manner. Moreover, in an advantageous embodiment of the invention it is also possible to achieve pressure compensation, e.g. during fluctuating temperatures, in a simple and inexpensive manner.

Several embodiments of the electric device according to the invention are possible. In one embodiment there is a single printed circuit board in the housing and an upper side of the printed circuit board is protected by one covering means and an underside of the printed circuit board is protected by another covering means so that all conductor paths and electronic components of the electronic circuit on the circuit board are protected against moisture by both covering means. A throughgoing duct is formed in the printed circuit board between the upper side and the underside of it to connect the spaces between the printed circuit board and the covering means so as to equalize pressure.

The covering means is advantageously a plastic cover impermeable to moisture. Alternatively it can comprise a plurality of plastic molded parts connected with the printed circuit board so as to tightly seal it against moisture. The housing can correspondingly be assembled from two parts.

In a preferred embodiment the covering means is at least partially permeable to air.

The housing can be at least partially metallic and the covering means can include insulating means for insulating the printed circuit board from the housing.

The covering means can be made electrically conductive by at least partially coating with an electrically conductive coating, advantageously electrically connected with the electronic circuit.

BRIEF DESCRIPTION OF THE DRAWING

The objects, features and advantages of the present invention will now be illustrated in more detail by the following detailed description, reference being made to the accompanying drawing in which:

The sole FIGURE is a longitudinal cross-sectional view through an electric device according to the invention.

DESCRIPTION OF THE PREFERRED EMBODIMENTS

The electric switching and control device has a printed circuit board 10. An electronic circuit, only some of whose electronic components 12 are shown, is arranged on its surface 11.

Further, a plug connector strip 14, known per se, is attached to the upper side 11 of the printed circuit board 10 at the front side 13 of the latter, its connection terminals 15 being connected with the printed circuit board 10 and circuit, respectively.

The upper side 11 of the printed circuit board 10 is covered by a hood-like half-shell 16 which is produced from a gas-permeable plastic as a molded part. The half-shell 16 has a recess 18 in its front side wall 17, which recess 18 encloses the plug connector strip 14. The remaining regions of the front side wall 17 and the other side walls 19 have a continuous edge 20 which contacts the printed circuit board 10 without reaching its outer edge. The dimensions of the half-shell 16 are selected in such a way that the circuit, its conductor paths, and the electronic components 12 are covered by it. The half-shell 16 is securely connected, e.g. cemented or welded, with the printed circuit board 10 and the plug connector strip 14.

The underside 22 of the printed circuit board 10 is likewise covered by a hood-shaped half-shell 23 whose side walls 24 have a circumferentially extending edge 25 which contacts the printed circuit board 10 and is likewise securely connected with it. The dimensions of the lower half-shell 23 are selected in such a way that the outer edge of the printed circuit board 10 is not reached on the one hand and conductor paths and solder connections of the circuit and components 12 are covered on the other hand.

The upper half-shell 16 is enclosed by a trough-shaped housing cover 27 which has a recess 29 enclosing the plug connector strip 14 in its front side wall 28. The remaining side walls 30 have a continuous edge 31 which contacts the outer area of the printed circuit board 10.

The lower half-shell 23 is enclosed by a housing base 32 which is also trough-shaped and whose front side wall 33 contacts the underside 34 of the plug connector strip 14. The remaining side walls 35 have a continuous edge 36 which contacts the outer area of the underside 22 of the printed circuit board 10.

The edges 31 and 36 of the housing cover 27 and housing base 32 have a plurality of aligned bore holes 37 which also penetrate the printed circuit board 10 and in which rivets 38 are inserted which securely connect the housing cover 27, the printed circuit board 10 and the housing base 32 with one another.

The space 40 enclosed by the upper half-shell 16, the printed circuit board 10 and the plug connector strip 14 is connected with the space 42 via a bore hole 41 in the printed circuit board 10. This space 42 is formed by the lower half-shell 23 and the printed circuit board 10.

The upper half-shell 16 and the lower half-shell 23 are produced as plastic molded parts from a plastic which is impermeable to water, but permeable to gas, and are connected with the printed circuit board so as to be tight against moisture. Suitable plastics for this purpose are, for example, polyamide, polyester, and polypropylene. The half-shells 16 and 23 are connected with the printed circuit board so as to be tight against moisture so that the spaces 42 and 40 and accordingly the circuit and its components 12 are protected from wetness. The housing cover 27 and the housing base 32 serve to protect against mechanical damage and also protect the printed circuit board 10 and components 12 as well as the half-shells 16 and 23. However, the housing base 32 and housing cover 27 need not assume a sealing function, so that costly sealing grooves and sealing rings can be dispensed with. A gas-permeable plastic for the half-shells 16 and 23 ensures a pressure equalization between the spaces 40 and 42 on the one hand and the atmosphere on the other hand. Pressure fluctuations during changes in temperature can accordingly be compensated for without transporting moisture into the interior of the spaces 40, 42. The two spaces 40 and 42 are connected via the bore holes 41 so that the same pressure prevails in both spaces 40 and 42.

It is also possible to construct only a portion of a half-shell 16 or 23 so as to be gas-permeable so as to ensure a pressure equalization. To this end, for example, the two half-shells are manufactured from a plastic which is impermeable to water and gas and one of the two half-shells has a window-like opening which is covered by a gas-permeable plastic in the form of a diaphragm. Such a plastic diaphragm can be produced from PTFE, for example. This diaphragm is then mechanically protected and is also protected against splashed or sprayed water by the housing (housing cover 27 and housing base 32) and, in contrast to conventional solutions, requires no additional parts.

If the housing cover 27 and housing base 32 are manufactured from metal, e.g. to carry out a shielding function, the half-shells 16 and 23 can also assume an insulating function. For this purpose, for example, the edges 20 and 25 are constructed in such a way that they cover and accordingly insulate the area between the edges 31 and 36 of the housing cover 27 and housing base 32 on the one hand and the printed circuit board 10 on the other hand.

If the housing cover 27 and housing base 32 are not manufactured from metal, the half-shells 16 and 23 can assume shielding functions. For this purpose, they are partially or completely provided with a metallic or electrically conductive coating which is connected with the printed circuit board so as to be electrically conductive. It is also possible to produce the half-shells (16, 23) completely from an electrically conductive, gas-permeable and moisture-tight material.

As a result of the separation of the protective functions against mechanical strain and the protection against moisture, optimal and inexpensive solutions can be employed for each of the two functions. The housing cover 27 and housing base 32 have no sealing functions so that costly sealing contours are dispensed with. This enables simple constructions.

While the invention has been illustrated and embodied in an electric device, particularly in a switching and control device for motor vehicles, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims.

We claim:

1. Electric device comprising
   a housing;
   at least one printed circuit board arranged in said housing and carrying an electronic circuit; and
   at least one covering means arranged in said housing and formed to protect said printed circuit board from moisture, said covering means being moisture-impermeable but being at least partially gas-permeable.

2. Electric device as defined in claim 1, wherein said electronic circuit comprises conductor paths and electronic components, and wherein an upper side of said at least one printed circuit board is protected by one of said at least one covering means and an underside of said at least one printed circuit board is protected by another of said at least one covering means so that all of said conductor paths and said electronic components of said electronic circuit are protected against moisture by said at least one covering means.

3. Electric device as defined in claim 1, wherein said at least one covering means is a plastic cover impermeable to moisture.

4. Electric device as defined in claim 1, wherein said at least one covering means comprises a plurality of plastic molded parts connected with said at least one printed circuit board so as to tightly seal against moisture.

5. Electric device as defined in claim 1, wherein said at least one covering means is at least partially permeable to air.

6. Electric device as defined in claim 1, wherein an upper side and an underside of said at least one printed circuit board are connected by a duct.

7. Electric device as defined in claim 1, wherein said housing is metallic and said at least one covering means includes insulating means for insulating said at least one printed circuit board from said housing.

8. Electric device as defined in claim 1, wherein said housing is composed of at least two housing parts.

9. Electric device as defined in claim 1, further comprising a plug connector strip attached to said at least one printed circuit board and at least partially enclosed by said at least one covering means.

10. Electric device as defined in claim 1, wherein said at least one covering means is at least partially coated with an electrically conductive coating.

11. Electric device as defined in claim 10, wherein said electrically conductive coating is connected electrically with said electronic circuit on said at least one printed circuit board.

12. Electric device as defined in claim 1, wherein said at least one covering means is electrically conductive.

* * * * *